United States Patent
Cha et al.

(10) Patent No.: US 10,340,714 B2
(45) Date of Patent: Jul. 2, 2019

(54) SYSTEM FOR CONTROLLING OUTPUT PARAMETER OF SECONDARY BATTERY, AND METHOD THEREFOR

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 36 days.

(21) Appl. No.: 15/567,434

(22) PCT Filed: Nov. 14, 2016

(86) PCT No.: PCT/KR2016/013073
§ 371 (c)(1),
(2) Date: Oct. 18, 2017

(87) PCT Pub. No.: WO2017/082705
PCT Pub. Date: May 18, 2017

(65) Prior Publication Data
US 2018/0090962 A1    Mar. 29, 2018

(30) Foreign Application Priority Data
Nov. 13, 2015   (KR) ........................ 10-2015-0159813

(51) Int. Cl.
*H02J 7/00* (2006.01)
*G01R 31/3842* (2019.01)
(Continued)

(52) U.S. Cl.
CPC ............ *H02J 7/0063* (2013.01); *G01K 1/024* (2013.01); *G01R 31/36* (2013.01);
(Continued)

(58) Field of Classification Search
CPC ...... H01M 10/44; H02J 7/0026; H02J 7/0029; H02J 7/0031; H02J 7/0063; H02J 7/007; H02J 7/0069; H02J 7/0091
(Continued)

(56) References Cited

U.S. PATENT DOCUMENTS

| 5,672,951 A | 9/1997 | Shiota |
| 2006/0152196 A1 | 7/2006 | Matsumoto et al. |

(Continued)

FOREIGN PATENT DOCUMENTS

| JP | 8-140270 A | 5/1996 |
| JP | 2007-236115 A | 9/2007 |

(Continued)

OTHER PUBLICATIONS

International Search Report, issued in PCT/KR2016/013073 (PCT/ISA/210), dated Feb. 28, 2017.
(Continued)

*Primary Examiner* — Paul Dinh
(74) *Attorney, Agent, or Firm* — Birch, Stewart, Kolasch & Birch, LLP (57) ABSTRACT

The present disclosure discloses a system and method of adjusting an output parameter of a secondary battery. The system according to the present disclosure determines a voltage, a current, and a temperature of the secondary battery, determines a state of charge of the secondary battery using the current, determines a deration target current value calculated from a maximum value of a predefined resistance change rate, which corresponds to the state of charge and the temperature, and an output maintaining time, when the voltage of the secondary battery decreases to a preset threshold voltage or lower, and provides an output parameter including at least one of the deration target current value and a deration target output value determined therefrom to a
(Continued)

control system of a load device supplied with power from the secondary battery.

15 Claims, 6 Drawing Sheets

(51) Int. Cl.
*G01R 31/36* (2019.01)
*H01M 10/42* (2006.01)
*H01M 10/44* (2006.01)
*H01M 10/48* (2006.01)
*G01K 1/02* (2006.01)
*B60L 53/00* (2019.01)
*B60L 58/12* (2019.01)

(52) U.S. Cl.
CPC ..... *G01R 31/3648* (2013.01); *G01R 31/3842* (2019.01); *H01M 10/42* (2013.01); *H01M 10/44* (2013.01); *H01M 10/48* (2013.01); *H02J 7/007* (2013.01); *H02J 7/0029* (2013.01); *H02J 7/0068* (2013.01); *B60L 53/00* (2019.02); *B60L 58/12* (2019.02); *G01K 1/022* (2013.01); *H02J 2007/005* (2013.01); *H02J 2007/0067* (2013.01)

(58) Field of Classification Search
USPC .......................................... 320/134, 136, 138
See application file for complete search history.

(56) References Cited

U.S. PATENT DOCUMENTS

| | | | |
|---|---|---|---|
| 2010/0001693 A1* | 1/2010 | Iida | H01M 10/425 320/134 |
| 2010/0156356 A1* | 6/2010 | Asakura | H01M 10/44 320/148 |
| 2011/0187314 A1 | 8/2011 | Kim | |
| 2012/0206107 A1* | 8/2012 | Ono | H02J 7/0029 320/136 |

FOREIGN PATENT DOCUMENTS

| | | |
|---|---|---|
| KR | 10-0680901 B1 | 2/2007 |
| KR | 10-2007-0049315 A | 5/2007 |
| KR | 10-2011-0090212 A | 8/2011 |

OTHER PUBLICATIONS

Plett, "Extended Kalman filterin for battery management systems of LiPB-based HEV battery packs", Journal of Power Sources 2004, vol. 134, pp. 252-291.

* cited by examiner

SYSTEM FOR CONTROLLING OUTPUT PARAMETER OF SECONDARY BATTERY, AND METHOD THEREFOR

TECHNICAL FIELD

The present disclosure relates to a system and method of stably adjusting an output parameter of a secondary battery during a voltage range where a voltage of the secondary battery changes fast.

The present application claims priority to Korean Patent Application No. 10-2015-0159813 filed on Nov. 13, 2015 in the Republic of Korea, the disclosure of which is incorporated herein by reference.

BACKGROUND ART

A secondary battery has been used as a power source in various fields because it is repeatedly chargeable and rechargeable.

A secondary battery is used in a hand-held device such as a cellular phone, a laptop computer, a digital camera, a video camera, a tablet computer, an electric-powered tool, etc.

The secondary battery is also used in various electric-driven power devices such as an electric bicycle, an electric motorcycle, an electric vehicle, a hybrid vehicle, an electric ship, an electric airplane, etc.

The application field of the secondary battery has been expanded to a power storage device used to store power generated using renewable energy or surplus generated power or an uninterruptible power system (UPS) for stably supplying power to various information communication devices including a server computer, a communication base station, etc.

The secondary battery is connected to a load device through a power conversion device such as an inverter. The load device means an arbitrary device using power stored in the secondary battery.

The load device includes a control system. The control system is provided with an output parameter for the secondary battery from a BMS system.

The output parameter is a factor indicating discharging capability or charging capability of the secondary battery, and is updated according to a state of charge and a temperature of the secondary battery. The output parameter is a maximum current capable of flowing through the secondary battery when the secondary battery is discharged or charged, or an available power calculated from the maximum current.

The control system controls charging and discharging of the secondary battery in a range of the output parameter if the control system is provided with the output parameter from the BMS system. That is, the control system controls the power conversion device, thereby the output of the secondary battery limited to the available power or lower, or the magnitude of charging or discharging current limited to the maximum current or lower.

Meanwhile, a voltage of the secondary battery changes fast as the voltage approaches a discharging lower limit voltage or a charging upper limit voltage.

Figure 1:
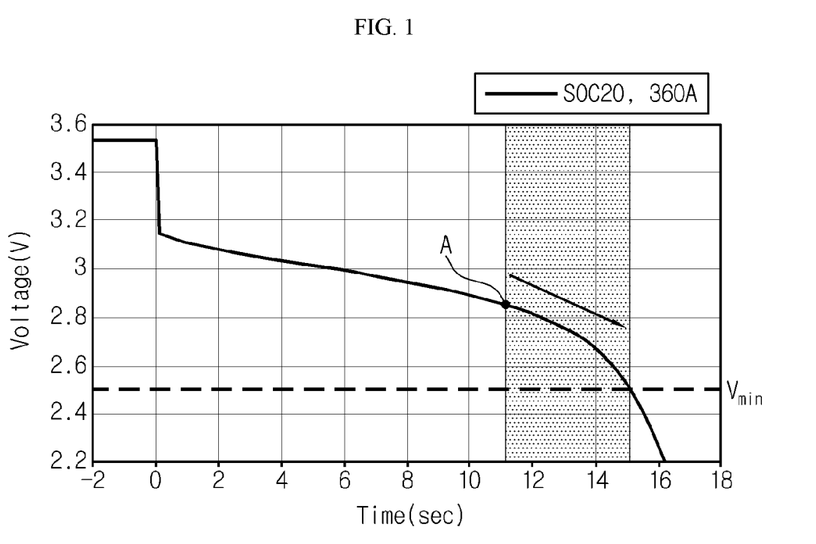
FIG. 1 is a discharging profile showing a pattern of a voltage change in case of a lithium secondary battery having a capacity of 36 Ah discharged with a constant current of 360 A when a state of charge of the lithium secondary battery is 20%.

FIG. 1 is a graph showing a pattern of a voltage change in case of a lithium secondary battery having a capacity of 36 Ah discharged with a constant current of 360 A when a state of charge of the lithium secondary battery is 20%.

As is shown, as a voltage of the secondary battery approaches a discharging lower limit $V_{min}$ (see a dot A), a deceleration rate of the voltage abruptly increases. This phenomenon also occurs in a charging situation of the secondary battery. That is, when the secondary battery is charged with a constant current of 360 A, an acceleration rate of the voltage abruptly increases as the voltage approaches a charging upper voltage.

Accordingly, if the voltage change rate of the secondary battery starts increasing, the BMS system needs to derate an output parameter to be provided to the control system. By doing so, it is possible to prevent the secondary battery from deviating from an operating voltage range in the latter half of discharging or charging period.

DISCLOSURE

Technical Problem

The present disclosure is designed under the above-described background of the related art, and therefore the present disclosure is directed to providing a system and method of adjusting an output parameter at a proper timing when a voltage of a secondary battery approaches a limit value of an operating voltage range.

Technical Solution

In one aspect of the present disclosure, there is provided a system for adjusting an output parameter of a secondary battery, the system including a voltage measurement unit, a current measurement unit, and a temperature measurement unit configured to measure a voltage, a current, and a temperature of the secondary battery, respectively, and a control unit configured to be electrically connected with the voltage measurement unit, the current measurement unit, and the temperature measurement unit.

Preferably, the control unit may be configured to receive a measurement result from the voltage measurement unit, the current measurement unit, and the temperature measurement unit and determine a voltage, a current, and a temperature of the secondary battery during discharging of the secondary battery, to determine a state of charge of the secondary battery using the current, to determine a deration target current value calculated from a maximum value of a predefined resistance change rate, which corresponds to the state of charge and the temperature, and an output maintaining time, when the voltage of the secondary battery decreases to a preset threshold voltage or lower, and to provide an output parameter including at least one of the deration target current value and a deration target output value determined therefrom to a control system of a load device supplied with power from the secondary battery.

Preferably, when a time taken until the output parameter is applied is defined as a delay time, a level of the threshold voltage is set such that when the secondary battery is discharged in a maximum discharging current value corresponding to the state of charge and the temperature, a time taken until a voltage of the secondary battery decreases to a discharging lower limit voltage from the threshold voltage is greater than the delay time and less than the output maintaining time.

Preferably, the control unit may be configured to determine a deration target current value of the secondary battery using an equation given below.

$$I_{derate} = \frac{V_{min} - V_{threshold} + I_0 \times R_0}{R_0 + \left[\frac{dR}{dt}\right]_{max}(t_1 - t_0)}$$

($I_{derate}$ indicates a deration target current value, $V_{min}$ indicates a discharging lower limit voltage, $V_{threshold}$ indicates a threshold voltage, $I_0$ indicates a discharging current value when a voltage of the secondary battery reaches the threshold voltage or a maximum discharging current value corresponding to a state of charge and a temperature of the secondary battery, $R_0$ indicates an internal resistance of the secondary battery, $t_1-t_0$ indicates an output maintaining time, $(dR/dt)_{max}$ indicates a value obtained by dividing, by a magnitude of a maximum discharging current, $I_{max}$, a maximum of absolute values of a primary differential value dV/dt calculated with respect to a discharging profile corresponding to the state of charge and the temperature of the secondary battery between two intersections at which the discharging profile meets a straight line $V=V_{threshold}$ and a straight line $V=V_{min}$, and $I_{max}$ indicates a maximum discharging current value corresponding to the state of charge and the temperature of the secondary battery.)

Preferably, the control unit may be configured to determine a deration target output value based on multiplication of a deration target current value and a discharging lower limit voltage.

According to an aspect, the system according to the present disclosure may further include a memory unit configured to store a maximum value of a predefined resistance change rate corresponding to the state of charge and the temperature.

According to another aspect, the system according to the present disclosure may further include a communication interface electrically coupled with the control unit, and the control unit may be configured to periodically transmit the output parameter to the control system through the communication interface.

Selectively, the control unit may be configured to determine a maximum discharging current value corresponding to a state of charge and a temperature of the secondary battery by referring to data of a maximum discharging current value that is predefined for each state of charge and each temperature of the secondary battery when a voltage of the secondary battery is higher than the threshold voltage, and to provide an output parameter including at least one of the maximum discharging current value and an available output value calculated from the maximum discharging current value to a control system of the load device.

In another aspect of the present disclosure, there is provided a method of adjusting an output parameter of a secondary battery, the method including measuring a voltage, a current, and a temperature of the secondary battery during discharging of the secondary battery, determining the state of charge of the secondary battery by using the current, determining a deration target current value from a maximum value of a predefined resistance change rate, which corresponds to the state of charge and the temperature, and an output maintaining time, when the voltage of the secondary battery decreases to a preset threshold voltage or lower, determining an output parameter including at least one of the deration target current value and the deration target output value determined therefrom, and providing the output parameter to a control system of a load device supplied with power from the secondary battery.

In another aspect of the present disclosure, there is provided a system for adjusting an output parameter of a secondary battery, the system including a voltage measurement unit, a current measurement unit, and a temperature measurement unit configured to measure a voltage, a current, and a temperature of the secondary battery, respectively, and a control unit configured to be electrically connected with the voltage measurement unit, the current measurement unit, and the temperature measurement unit.

Preferably, the control unit may be configured to receive a measurement result from the voltage measurement unit, the current measurement unit, and the temperature measurement unit and determine a voltage, a current, and a temperature of the secondary battery during charging of the secondary battery, to determine a state of charge of the secondary battery using the current, to determine a deration target current value calculated from a maximum value of a predefined resistance change rate, which corresponds to the state of charge and the temperature, and an output maintaining time, when the voltage of the secondary battery increases to a preset threshold voltage or higher, and to provide an output parameter including at least one of the deration target current value and a deration target output value determined therefrom to a control system of a load device supplied with power from the secondary battery.

In another aspect of the present disclosure, there is provided a method of adjusting an output parameter of a secondary battery, the method including measuring a voltage, a current, and a temperature of the secondary battery during charging of the secondary battery, determining the state of charge of the secondary battery by using the current, determining a deration target current value from a maximum value of a predefined resistance change rate, which corresponds to the state of charge and the temperature, and an output maintaining time, when the voltage of the secondary battery increases to a preset threshold voltage or higher, determining an output parameter including at least one of the deration target current value and the deration target output value determined therefrom, and providing the output parameter to a control system of a load device supplying charging power to the secondary battery.

Advantageous Effects

According to the present disclosure, the magnitude of a current flowing through the secondary battery or an output is derated at a proper timing, such that even if an output parameter is applied after the delay time, the voltage of the secondary battery does not deviate from an operating voltage range.

Furthermore, from a timing at which a time required until the voltage of the secondary battery changes from the threshold voltage to the operating limit voltage becomes shorter than the preset output maintaining time, the output of the secondary battery is actively derated, thereby maintaining the output of the secondary battery for the output maintaining time or longer.

The present disclosure prevents the voltage of the secondary battery from deviating from the operation voltage range when the voltage of the secondary battery approaches the operation limit voltage.

DESCRIPTION OF DRAWINGS

The accompanying drawings illustrate a preferred embodiment of the present disclosure and together with the foregoing disclosure, serve to provide further understanding of the technical concept of the present disclosure, and thus, the present disclosure is not construed as being limited to the drawing.

BEST MODE

Hereinafter, embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In an embodiment described below, a secondary battery refers to a lithium secondary battery. Herein, the lithium secondary battery collectively refers to a secondary battery where during charging and discharging, a lithium ion works as an operating ion and causes electrochemical reaction in a cathode and an anode.

Meanwhile, even if a name of a secondary battery changes due to a type of an electrolyte or a separation film, a type of a packing material used to pack the secondary battery, and an internal or outer structure of the lithium secondary battery, any secondary battery should be construed as falling within a scope of the lithium secondary battery as long as a lithium ion is used as an operating ion.

The present invention is also applicable to secondary batteries other than the lithium secondary battery. Thus, any secondary battery to which the present disclosure is applicable even if the operating ion is not the lithium ion should be construed as falling within a scope of the present disclosure regardless of a type of the secondary battery.

Moreover, the second battery is not limited by the number of elements constituting the secondary battery. Thus, the secondary battery should be interpreted as including not only a unit cell comprising an assembly of a cathode/a separator film/an anode and an electrolyte in one packing material but also an assembly of unit cells connected in series and/or in parallel, a module in which a plurality of assemblies are connected in series and/or in parallel, a pack in which a plurality of modules are connected in series and/or in parallel, and an electric system where a plurality of packs are connected in series and/or in parallel.

Figure 2:
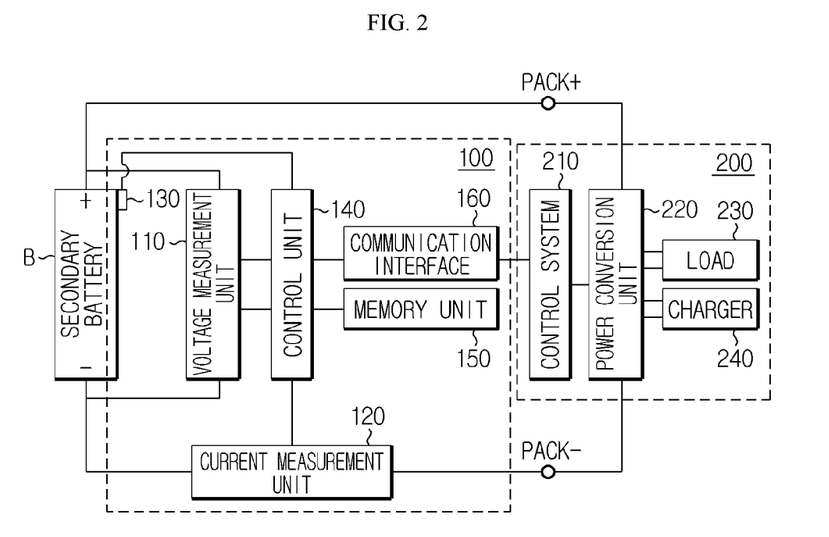
FIG. 2 is a block diagram of a system for adjusting an output parameter of a secondary battery according to an embodiment of the present disclosure.

FIG. 2 is a block diagram of a system 100 for adjusting an output parameter of a secondary battery according to an embodiment of the present disclosure.

Referring to FIG. 2, the system 100 according to an embodiment of the present disclosure may include a voltage measurement unit 110, a current measurement unit 120, a temperature measurement unit 130, and a control unit 120, and during discharging of a secondary battery B, derates an output parameter of the secondary battery B when a voltage of the secondary battery B decreases to a preset threshold voltage.

The secondary battery B is electrically connected with a load device 200 through a high-potential terminal PACK+ and a low-potential terminal PACK−. The load device 200 refers to a device operating with power output from the secondary battery B.

The load device 200 may include a control system 210, a power conversion unit 220, and a load 230. The load device 200 may, selectively, further include a charger 240. The charger 240 provides a charging current capable of charging the secondary battery B to the secondary battery B through the power conversion unit 220. The charger 240 may generate a charging current in itself, or may be provided with power from a normal power source to generate a charging current.

In an exemplary embodiment, the load 230 may be a motor included in an electric vehicle or a hybrid vehicle, and the power conversion unit 220 may be an inverter capable of performing bidirectional power conversion.

The control system 210 is a computing system for controlling an overall operation of the load device 200. In particular, the control system 210 controls discharging of the secondary battery B by using the output parameter of the secondary battery B provided by the control unit 140. That is, the control system 210 controls discharging of the secondary battery B by controlling the power conversion unit 220 under discharging conditions corresponding to the output parameter.

The power conversion unit 220 delivers the discharging output of the secondary battery B toward the load 230. In this case, the power conversion unit 220 adjusts the amount of power conversion under the control of the control system 210 such that the secondary battery is discharged within a range of the output parameter.

On the other hand, the power conversion unit 220 may also deliver a charging output supplied from the charger 240 toward the secondary battery B. In this case, the power conversion unit 220 adjusts the amount of power conversion under the control of the control system 210 such that the secondary battery is charged within a range of the output parameter.

The system 100 according to the present disclosure may further include a memory unit 150. The memory unit 150 is not specifically limited in its type as long as it is a storage medium to and from which information is recordable and erasable.

For example, the memory unit 150 may be a random access memory (RAM), a read only memory (ROM), a register, a hard-disk, an optical recording medium, or a magnetic recording medium.

The memory unit 150 is electrically connected with the control unit 140 through, for example, a data bus, etc., to allow an access to the memory unit 150 by the control unit 140.

The memory unit 150 stores and/or updates and/or erases and/or transmits a program including various control logics executed by the control unit 140 and/or data generated when the control logics are executed.

The memory unit 150 is logically divided into two parts or more and inclusion thereof in the control unit 140 is not limited.

The voltage measurement unit 110 is electrically coupled with the control unit 140 to exchange electric signals. The voltage measurement unit 110 measures a voltage applied between the cathode and the anode of the secondary battery B at predetermined time interval and outputs a signal indicating the measured magnitude of the voltage to the control unit 140 under control of the control unit 140. The control unit 140 determines the voltage of the secondary battery B based on the signal output from the voltage measurement unit 110 and stores the determined voltage value in the memory unit 150. The voltage measurement unit 110 may include a voltage measurement circuit generally used in this field.

The current measurement unit 120 is electrically coupled with the control unit 140 to exchange electric signals. The current measurement unit 120 periodically measures a magnitude of a current flowing through the secondary battery B at predetermined time intervals and outputs a signal indicating the measured magnitude of the current to the control unit 140 under control of the control unit 140. The control unit 140 determines the magnitude of the current based on the signal output from the current measurement unit 120 and stores the determined current value in the memory unit 150. The current measurement unit 120 may include a hole sensor or a sense resistor generally used in this field.

The temperature measurement unit 130 is electrically coupled with the control unit 140 to exchange electric signals. The temperature measurement unit 130 periodically measures a temperature of the secondary battery B at predetermined time intervals and outputs a signal indicating the measured temperature to the control unit 140 under control of the control unit 140. The control unit 140 determines the temperature value of the secondary battery B based on the signal output from the temperature measurement unit 130 and stores the determined temperature value in the memory unit 150. The temperature measurement unit 130 may include a thermocouple generally used in this field.

The system 100 according to the present disclosure may further include a communication interface 160. The communication interface 160 is an element necessary for the control unit 140 to perform communication with the control system 210 included in the load device 200.

Any known communication interface may be used as the communication interface 160 if the communication interface 160 supports communication between two different systems. The communication interface may support wired or wireless communication. Preferably, the communication interface may support CANN communication or Daisy Chain communication.

The control unit 140 may determine the state of charge of the secondary battery B by selectively using a voltage measurement value, a current measurement value, and a temperature measurement value stored in the memory unit 150.

The state of charge may be determined by adding up a current measured periodically by the current measurement unit 120. This scheme is well known as an ampere counting method and thus will not be described in detail.

The state of charge may be determined using an adaptive algorithm such as an extended Kalman filter based on circuit modeling of the secondary battery B. Estimation of the state of charge using the extended Kalman filter may refer to, by way of example, the paper of Gregory L. Plett, "Extended Kalman filtering for battery management systems of LiPB-based HEV battery packs Parts 1, 2 and 3" (Journal of Power Source 134, 2004, 252-261), and may be incorporated herein as a part of the present specification.

The state of charge may be determined by using other known methods capable of estimating the state of charge by selectively using a voltage, a temperature, and a current of the secondary battery B as well as the above-described ampere counting method or extended Kalman filter.

The control unit 140 monitors a voltage level of the secondary battery B measured by the voltage measurement unit 110 during discharging of the secondary battery B.

The control unit 140 differently determines an output parameter of the secondary battery B according to a voltage level of the secondary battery B. That is, if a voltage of the secondary battery B is greater than a threshold voltage, the output parameter is determined in a normal mode. In contrast, if the voltage of the secondary battery B is equal to or lower than a preset threshold voltage, the output parameter is determined in a deration mode.

The level of the threshold voltage is determined in advance based on two time factors. One time factor is a delay time until the output parameter determined by the control unit 140 is delivered to the control system 210 and is actually applied in discharging control over the secondary battery B. Another time factor is an output maintaining time at least during which a discharging output of the second battery B based on the output parameter has to be maintained.

The delay time factor varies with operation speeds of the control unit 140 and the control system 210 included in the load device 200, a speed of communication between the control unit 140 and the control system 210, and so forth. The delay time factor may be a time value within several seconds, e.g., 2 seconds.

The output maintaining time factor changes according to output characteristics required by the load 230 included in the load device 200. The output maintaining time factor may be a time value within several seconds, e.g., 6 seconds.

A method of setting a threshold voltage based on the delay time factor and the output maintaining time factor is as follows.

First, a constant current discharging test is conducted at a room temperature (25 degrees) for each state of charge of the secondary battery B to obtain a plurality of discharging profiles.

Figure 3:
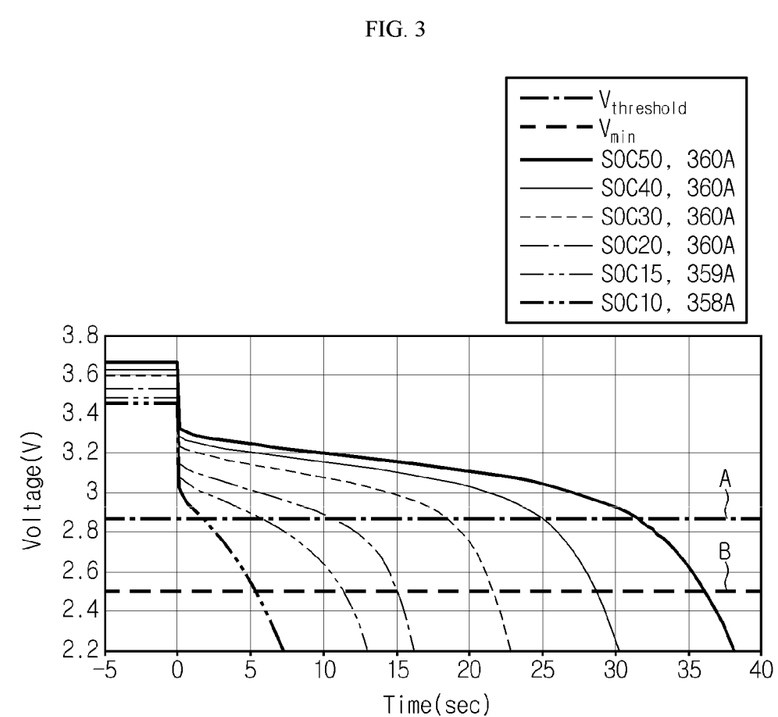
FIG. 3 is a graph showing a measurement result of a discharging profile with respect to six lithium secondary batteries having the same capacity of 36 Ah but different state of charges of 10%, 15%, 20%, 30%, 40%, and 50%.

FIG. 3 is a graph showing a measurement result of a discharging profile with respect to six lithium secondary batteries having the same capacity of 36 Ah but different state of charges of 10%, 15%, 20%, 30%, 40%, and 50%, respectively. From the left to the right, the state of charge of the secondary battery B for which a discharging profile is measured increases.

In each constant current discharging test, a magnitude of an applied discharging current is a maximum discharging current value corresponding to a state of charge and a temperature. A maximum discharging current value corresponding to a specific state of discharge and a specific temperature is a discharging current value which causes the voltage of the secondary battery B to reach a discharging lower limit voltage value $V_{min}$ when the secondary battery B is pulse-discharged using a hybrid pulse power characterization (HPPC) method.

Preferably, if the maximum discharging current value determined using the HPPC method is greater than a discharging upper limit current value set for safety of the secondary battery B, the maximum discharging current value is substituted by the discharging upper limit current value.

When a constant-current discharging test for obtaining the discharging profiles shown in FIG. 3 is conducted, the discharging upper limit current value is set to 360 A.

In FIG. 3, the maximum discharging current value applied when each discharging profile is obtained is indicated on the upper part of the graph. That is, the maximum discharging current value corresponding to each of the state of charges 20%, 30%, 40%, and 50% is the same as 360 A. Since the maximum discharging current value determined using the HPPC method exceeds 360 A set as the discharging upper limit current value, the maximum discharging current value is substituted by the discharging upper limit current value. Instead, when the states of the secondary battery B are 10% and 15%, the maximum discharging current value determined using the HPPC method is less than the discharging upper limit current value, 360 A. As such, the maximum discharging current value determined using the HPPC method is applied as it is.

In FIG. 3, a horizontal dotted line A indicates a level of a threshold voltage $V_{threshold}$ that is set based on a delay time factor and an output maintaining time factor, and a horizontal dotted line B indicates a level of the discharging lower limit voltage $V_{min}$.

Preferably, the level of the threshold voltage is set such that a time difference between two points at which each discharging profile meets the horizontal dotted lines A and B is greater than the delay time and less than the output maintaining time.

Once the level of the threshold voltage is set in this way, it is possible to prevent the voltage of the secondary battery B from abruptly decreasing to below the discharging lower limit voltage even if a timing when the output parameter determined in the deration mode is applied is delayed by the delay time. Moreover, when a time needed until the voltage of the secondary battery B is reduced to the discharging lower limit voltage is shorter than the output maintaining time, the output of the secondary battery B may be derated to secure the minimum output maintaining time.

Figure 4:
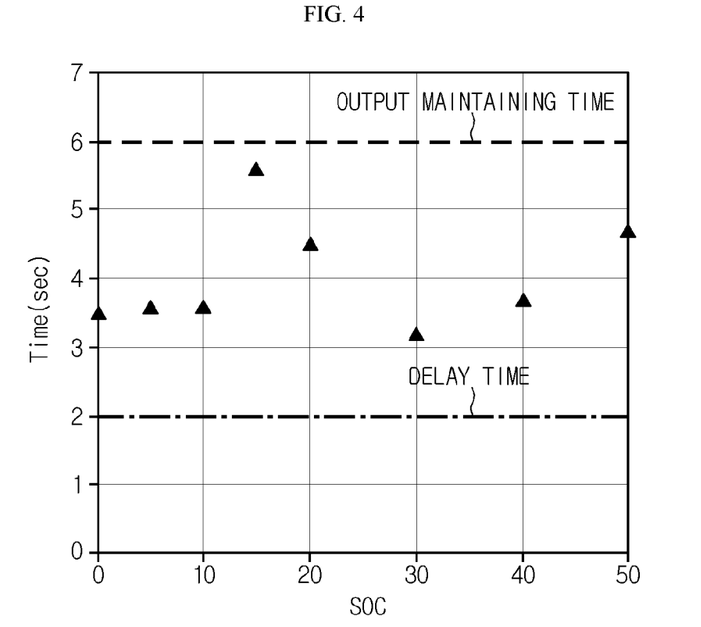
FIG. 4 is a graph showing a time difference (see a mark ▲) between two points at which each discharging profile shown in FIG. 3 meets a horizontal dotted line A and a horizontal dotted line B, respectively.

FIG. 4 shows a time difference (see a mark ▲) between two points at which each discharging profile shown in FIG. 3 meets a horizontal dotted line A and a horizontal dotted line B, respectively. The delay time was set to 2 seconds, and the output maintaining time was set to 6 seconds, and the level of the threshold voltage was set to 2.87V. Referring to FIG. 4, it can be seen that a level of a threshold voltage indicated by the horizontal dotted line A of FIG. 3 satisfies the above-mentioned conditions. Thus, the output parameter is determined in the deration mode when the voltage of the secondary battery B reaches 2.78V, and if the determined output parameter is provided to the control system 210 of the load device 200, then the output of the secondary battery B may be maintained for at least 6 seconds. Moreover, in spite of a delay time of 2 seconds until the output parameter is applied to the load device 200, the voltage of the secondary battery B may not abruptly decrease to the discharging lower limit voltage.

In the present disclosure, discharging profiles shown in FIG. 3 were obtained from room temperature conditions.

However, it would be obvious to those of ordinary skill in the art that it is desirable to additionally obtain discharging profiles for each temperature condition belonging to the operating temperature range of the secondary battery B and to determine a level of a threshold voltage in such a way to satisfy the above-described condition for all of a plurality of discharging profiles obtained for each temperature.

That is, it is desirable to set the level of the threshold voltage such that a time difference between two points at which each discharging profile measured for each state of charge and for each temperature meets the horizontal dotted lines A and B is greater than the delay time and less than the output maintaining time.

In an example, the level of the threshold voltage varies with the temperature of the second battery B. That is, as the temperature of the secondary battery B increases, the level of the threshold voltage may increase. As the level of the threshold voltage increases, a start timing of the deration mode is quickened.

The control unit 140 determines the output parameter in the normal mode when the current voltage of the secondary battery B measured by the voltage measurement unit 110 is greater than a preset threshold voltage. The output parameter includes at least one of the maximum discharging current value and the available output value of the secondary battery B. The control unit 140 determines the maximum discharging current value by using a power map stored in the memory unit 150. The power map has a data structure to which the maximum discharging current value corresponding to the state of charge and the temperature of the secondary battery B is referred.

The available output value may be determined using Equation 1. In Equation 1, the maximum discharging current value is a current factor $I_{max}$.

$$\text{Available Output } P = V_{min} * I_{max} \qquad \text{<Equation 1>}$$

In Equation 1, $V_{min}$ indicates a preset voltage factor as the discharging lower limit voltage of the secondary battery B. $I_{max}$ indicates a current factor varying with the state of charge and the temperature of the secondary battery B and corresponds to the maximum discharging current the secondary battery B may output under conditions of a specific state of charge and a temperature. $I_{max}$ is a value mappable from a power map stored in the memory unit 150 by using the state of charge and the temperature of the secondary battery B.

Meanwhile, the control unit 140 determines the output parameter in the deration mode when the voltage of the secondary battery B measured by the voltage measurement unit 110 is less than or equal to a preset threshold voltage. The output parameter determined in the deration mode includes at least one of a deration target current value and a deration target output value of the secondary battery B.

The control unit 140 determines a deration target current value $I_{derate}$ based on Equation 2.

$$I_{derate} = \frac{V_{min} - V_{threshold} + I_0 \times R_0}{R_0 + \left[\frac{dR}{dt}\right]_{max}(t_1 - t_0)} \qquad \text{<Equation 2>}$$

Figure 5:
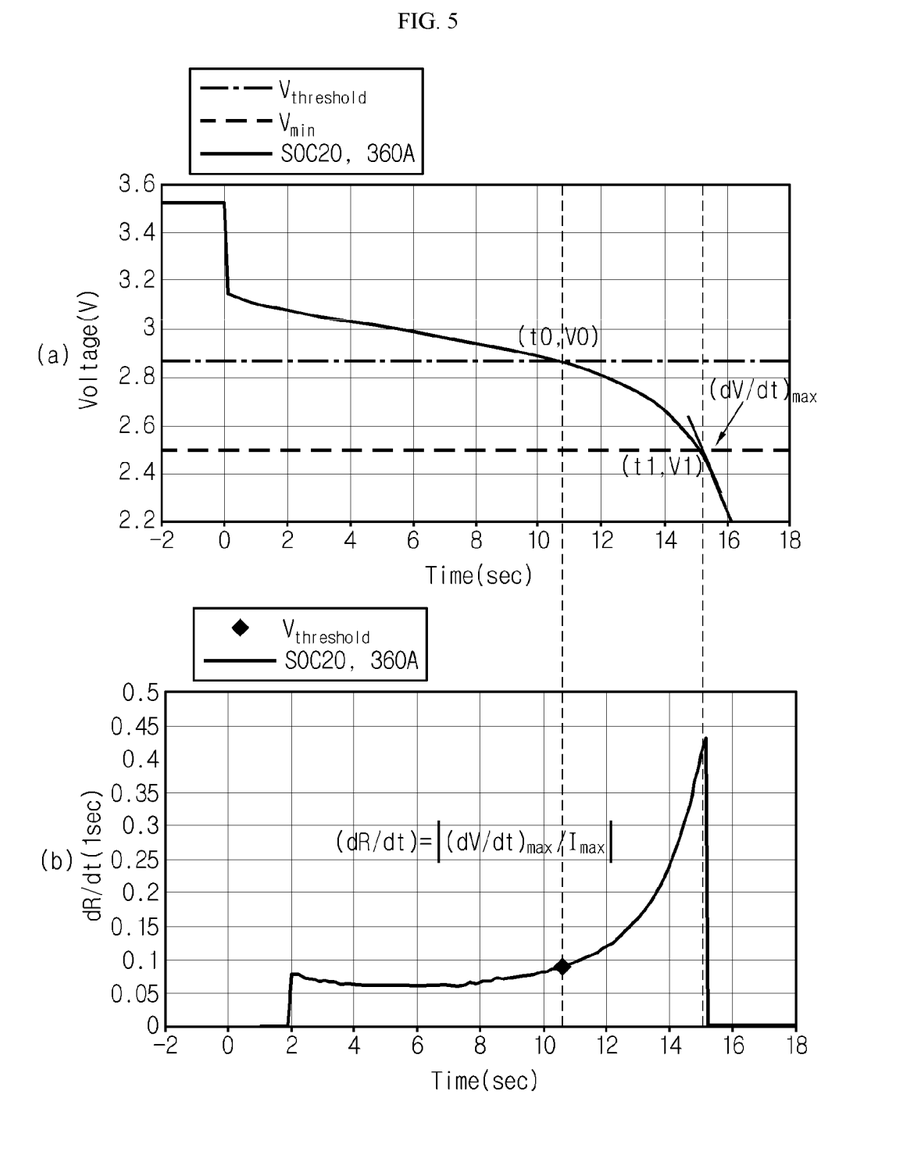
FIG. 5 is a diagram for describing a parameter of an equation used to determine a deration target current value according to an embodiment of the present disclosure.

FIG. 5 is a diagram for describing a parameter of an equation used to determine a deration target current value according to an embodiment of the present disclosure.

A discharging profile shown in a graph (a) of FIG. 5 is a discharging profile obtained by conducting a constant current discharging test at a temperature of 25 degrees Celsius with 360 A($I_{max}$) when the state of charge of the secondary battery B having a capacity of 36 Ah is 20%. $I_{max}$ is the maximum discharging current value allowed when the state of charge of the secondary battery B is 20%.

A graph (b) of FIG. 5 shows a resistance change (dR/dt) with respect to a time when the secondary battery B having a state of charge of 20% is discharged in 360 A. According to the Ohm's law, V=IR and I is constant as $I_{max}$. If both sides of V=IR are differentiated by time, the result is dV/dt=$I_{max}$dR/dt, and thus dR/dt is substantially the same as (dV/dt)/$I_{max}$. That is, dR/dt is determined using a slope of a tangential line of a discharging profile, (dV/dt).

Referring to FIG. 5, in Equation 2, $V_{min}$ is a discharging lower limit voltage. $V_{threshold}$ is a threshold voltage. $R_0$ is an internal resistance value of the secondary battery B, which is known in advance through a test. $V_{min}$, $V_{threshold}$, and $R_0$ are previously stored in the memory unit 150. $I_0$ is a discharging current value when a voltage of the secondary battery B reaches a threshold voltage. The discharging current value is measured by the current measurement unit 120. Alternatively, there is no special limitation on the use of the maximum discharging current value $I_{max}$ corresponding to the state of discharge and the temperature of the secondary battery B as $I_0$. $(dR/dt)_{max}$ is a maximum value of (dR/dt). $(dR/dt)_{max}$ is a result value of dividing the maximum value among absolute values of a primary differential value dV/dt calculated with respect to a discharging profile between two intersections at which the discharging profile meets a straight line V=$V_{threshold}$ and a straight line V=$V_{min}$ by a magnitude of the maximum discharging current, $I_{max}$. A timing when an absolute value of the primary differential value dV/dt becomes maximum changes with a variation pattern of a discharging profile. In the discharging profile shown in FIG. 5, the absolute value of dV/dt becomes maximum at a timing when the discharging profile meets the straight line V=$V_{min}$. Data regarding $(dR/dt)_{max}$ is determined in advance using discharging profiles measured for each state of charge and each temperature of the secondary battery B, and the data regarding $(dR/dt)_{max}$ defined for each state of charge and each temperature is stored in advance in the memory unit 150. ($t_1-t_0$) is a time period during which the voltage of the secondary battery B decreases from the threshold voltage to the discharging lower limit voltage. In an embodiment, the present disclosure allocates a preset output maintaining time as ($t_1-t_0$).

Equation 2 may be derived as below. The voltage of the secondary battery B is equivalently modeled by a circuit where an open circuit voltage component changing with a state of charge and a temperature of the secondary battery B, an internal resistance $R_0$, and an RC circuit (R//C) are connected in series.

According to the circuit modeling, a voltage V of the secondary battery B may be represented by a sum of three voltage components, i.e., an open circuit voltage component OCV(z) uniquely determined according to a state of charge z, a voltage component $IR_0$ applied to both ends of an internal resistance $R_0$ (a constant value), and a voltage component $I_{RC}R$ applied to both ends of an RC circuit when a current $I_{RC}$ flows in a resistor R of the RC circuit.

$$V=OCV(z)+IR_0+I_{RC}R \qquad \text{<Equation 3>}$$

By differentiating both sides of Equation 3 by time t, Equation 4 may be obtained as below.

$$dV/dt=dOCV/dt+(dI/dt)R_0+(dI_{RC}/dt)R+I_{RC}(dR/dt) \qquad \text{<Equation 4>}$$

Assuming that the state of charge of the secondary battery B and the current $I_{RC}$ flowing through the resistor of the RC circuit are constant during a time dt, then dOCV/dt and $dI_{RC}/dt$ become 0 and thus Equation 4 may be approximated by Equation 5 as below.

$$dV/dt=(dI/dt)R_0+I_{RC}(dR/dt) \qquad \text{<Equation 5>}$$

Meanwhile, let a voltage and a discharging current of the secondary battery B be $V_0$ and $I_0$, respectively, at a time $t_0$ of a point where a discharging profile meets a straight line V=$V_{threshold}$. In addition, suppose that the voltage and the discharging current of the secondary battery B be $V_1$ and $I_1$, respectively, at a time $t_1$ of a point where the discharging profile meets a straight line V=$V_{min}$. It is also assumed that $I_{RC}$ equals $I_1$ and (dR/dt) is constant between the time $t_0$ and the time $t_1$. Under such a definition, by integrating both sides of Equation 5 between the time $t_0$ and the time $t_1$, Equation 6 may be obtained.

$$V_1-V_0=(I_1-I_0)R_0+I_1(dR/dt)(t_1-t_0) \qquad \text{<Equation 6>}$$

If Equation 6 is arranged with respect to $I_1$, Equation 7 is obtained.

$$I_1 = \frac{V_1 - V_0 + I_0 \times R_0}{R_0 + \left[\frac{dR}{dt}\right] \times (t_1 - t_0)} \qquad \text{<Equation 7>}$$

In Equation 7, $V_0$ and $V_1$ correspond to a threshold voltage $V_{threshold}$ and a discharging lower limit voltage $V_{min}$ and thus $V_0$ and $V_1$ are substituted with $V_{threshold}$ and $V_{min}$, respectively. Moreover, among terms of a denominator, a maximum value of (dR/dt) values is allocated as (dR/dt) (see FIG. 5). In addition, a preset output maintaining time is allocated to (t1-t0). Then, Equation 7 is finally organized into a form like Equation 2.

As above, if a maximum value among (dR/dt) values calculated using a discharging profile corresponding to the state of charge and the temperature of the secondary battery B is allocated as (dR/dt), then the value $I_t$ may be used as a deration target current value $I_{derate}$.

In the right side of Equation 7, if $(dR/dt)_{max}$ is allocated as (dR/dt), then the denominator increases to the maximum value within an allowed range. Then, by sufficiently derating the discharging current at the time t1 when compared to the maximum discharging current mapped from a power map, the voltage of the secondary battery B may be prevented from decreasing to the discharging lower limit voltage or lower within a shorter time than the delay time or prior to the elapse of the output maintaining time even if the voltage of the secondary battery B is reduced lower than or equal to the threshold voltage.

The control unit 140 calculates the deration target current value using Equation 2 if the voltage of the secondary battery B is reduced lower than or equal to the threshold voltage, and further determines the deration target output value $P_{derate}$ from the deration target current value. An equation for $P_{derate}$ may be provided as below.

$$P_{derate}V_{min}*I_{derate} \qquad \text{<Equation 8>}$$

The control unit 140 transmits an output parameter including at least one of the deration target current value and the deration target output value to the control system 210 of the load device 200 through the communication interface 160.

The control system 210 controls the power conversion unit 220 using the output parameter transmitted from the control unit 140 to derate the discharging current or output of the secondary battery B after the elapse of the delay time. That is, the control system 210 controls the power conversion unit 220 by using the deration target current value or the deration target output value included in the output parameter such that the magnitude of the discharging current output from the secondary battery B is regulated to be smaller than the deration target current value or the output of the secondary battery B is regulated to be smaller than the deration target output value.

As a preferable example, the control system 210 controls the power conversion unit 220 to reduce the discharging current of the secondary battery B in a stepwise way with predetermined time intervals, thereby derating the magnitude of the discharging current to be the same e as the deration target current value. Similarly, the control system 210 controls the power conversion unit 220 to reduce the output of the secondary battery B in a stepwise manner with predetermined time intervals, thereby derating the magnitude of the output of the secondary battery to be the same as the deration target output value.

The control unit 140 may selectively include a processor, an application-specific integrated circuit (ASIC), another chipset, a logic circuit, a register, a communication modem, a data processor, and so forth, known in the field to execute the above-described various control logics. When the control logic is implemented with software, the control unit 140 may be implemented with a set of program modules. In this case, the program module is stored in a memory and executed by a processor. The memory may be located inside or outside the processor, and may be connected with the processor through well-known various computer parts. The memory may be also included in the memory unit 150 of the present disclosure. The memory collectively indicates a device in which information is stored, regardless of a type of the device, and does not indicate a specific memory device.

At least one of various control logics of the control unit 140 may be combined, and the combined control logics are written as a computer-readable code system and recorded in a computer-readable recording medium. The recording medium is not specially limited in its type as long as it is accessible by a processor included in the computer. For example, the recording medium may include at least one selected from a group consisting of a read only memory (ROM), a random access memory (RAM), a register, a compact disc (CD)-ROM, a magnetic tape, a hard disk, a floppy disk, and an optical data recording device. The code system may be stored and executed in a distributed manner in a computer connected through a network. Moreover, functional programs, codes and code segments for implementing the combined control logics may be easily programmed by programmers skilled in the art which the present disclosure pertains to.

Hereinafter, referring to FIG. 6, a method of adjusting an output parameter of a secondary battery, which is performed by the control unit 140, according to an embodiment of the present disclosure will be described.

Figure 6:
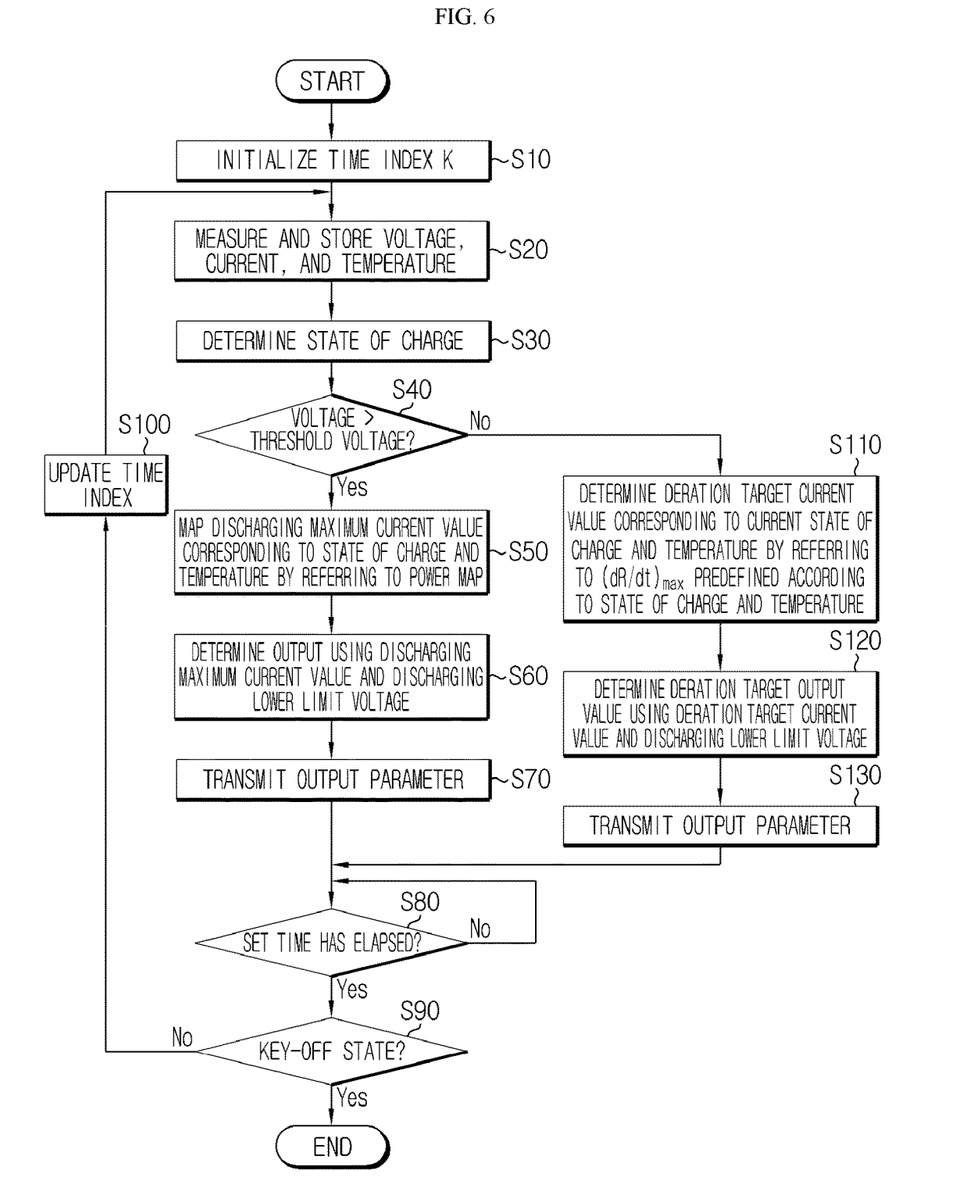
FIG. 6 is a flowchart of a method of adjusting an output parameter of a secondary battery according to an embodiment of the present disclosure.

FIG. 6 is a flowchart of a method of adjusting an output parameter of a secondary battery according to an embodiment of the present disclosure.

In operation S10, the control unit 140 initiates a time index k if a process for adjusting the output parameter of the secondary battery starts.

In operation S20, the control unit 140 measures a voltage, a current, and a temperature of the secondary battery B by using the voltage measurement unit 110, the current measurement unit 120, and the temperature measurement unit 130, and stores the measured voltage value, current value, and temperature value in the memory unit 150.

In operation S30, the control unit 140 may determine the state of charge of the secondary battery B by selectively using the voltage value, the current value, and the temperature value stored in the memory unit 150. The state of charge may be determined using the ampere counting method or extended Kalman filter.

In operation S40, the control unit 140 determines whether the voltage of the secondary battery B is greater than a predetermined threshold voltage $V_{threshold}$. A way to define the level of the threshold voltage has been described above with reference to FIGS. 3 and 4.

If the determination result is YES in operation S40, the control unit 140 proceeds to operation S50 in which the control unit 140 determines the output parameter in the normal mode and transmits the determined output parameter to the control system 210 of the load device 200 through the communication interface 160.

More specifically, in operation S50, the control unit 140 refers to the memory unit 150 to determine the current temperature and the current state of charge of the secondary battery B. The control unit 140 determines the maximum discharging current value $I_{max}$ by mapping the maximum discharging current value corresponding to the current state of charge and the current temperature from a power map stored in advance in the memory unit 150.

Next, in operation S60, the control unit 140 determines an available output value of the secondary battery B based on Equation 1 by using the maximum discharging current value $I_{max}$ and the predefined discharging lower limit voltage $V_{min}$.

In operation S70, the control unit 140 transmits an output parameter including at least one of the maximum discharging current value and the available output value to the control system 210 of the load device 200 through the communication interface 160. Then, the control system 210 controls the power conversion unit 220 by referring to the available output value or the maximum discharging current value included in the transmitted output parameter, thereby adaptively controlling the discharging of the secondary battery B within the available output value or the maximum discharging current value. That is, the discharging output of the secondary battery B is regulated to be less than or equal to the available output value, or the discharging current of the secondary battery B is regulated to be less than or equal to the maximum discharging current value.

Next, in operation S80, the control unit 140 determines whether a preset time has elapsed. The preset time corresponds to a period during which the output parameter of the secondary battery B is updated.

If the determination result is YES in operation S80, the control unit 140 goes to operation S90; on the other hand, if the determination result is No in operation S80, then the control unit 140 holds the progress of the process.

In operation S90, the control unit 140 determines whether the operation state of the secondary battery B is in a key-off state. Herein, the key-off state means that charging or discharging of the secondary battery B is stopped. The key-off state may be determined by an on or off state of a switch part that controls connection between the secondary battery B and the load device 200.

If the determination result is YES in operation S90, then the control unit 140 terminates the process because the control unit 140 does not need to adjust the output parameter of the secondary battery B. On the other hand, if the determination result is NO in operation S90, the control unit 140 goes to operation S100 to update a time index k and then goes to operation S20 to repeat execution of the above-described operations.

Meanwhile, if the determination result is NO in operation S40, the control unit 140 goes to operation S110. That is, the control unit 140 determines an output parameter of the secondary battery B and transmits the output parameter to the control system 210 of the load device 200 through the communication interface 160 in the deration mode.

More specifically, in operation S110, the control unit 140 refers to state of charge and temperature data stored in the memory unit 150 to determine the current temperature and the current state of charge of the secondary battery B. The control unit 140 also determines $(dR/dt)_{max}$ corresponding to the current state of charge and the current temperature by referring to $(dR/dt)_{max}$ data that is predefined with respect to a state of charge and a temperature stored in the memory unit 150. The control unit 140 also determines a deration target current value $I_{derate}$ using Equation 2. When the deration target current value is determined, the current discharging current value stored in the memory unit 150 may be allocated as $I_0$, or the maximum discharging current value corresponding to the current state of charge and the current temperature may be mapped from the power map and allocated as $I_0$. For other factors of Equation 2, that is, a discharging lower limit voltage $V_{min}$, a threshold voltage $V_{threshold}$, and an internal resistance $R_0$ of the secondary battery B, data stored in advance in the memory unit 150 is allocated. In addition, a preset output maintaining time is allocated to $(t_1-t_0)$.

Next, in operation S120, the control unit 140 determines the deration target output value $P_{derate}$ of the secondary battery B by using the deration target current value $I_{derate}$ and the predefined discharging lower limit voltage $V_{min}$.

In operation S130, the control unit 140 transmits an output parameter including at least one of the deration target current value $I_{derate}$ and the deration target output value $P_{derate}$ to the control system 210 of the load device 200 through the communication interface 160. Then, the control system 210 controls the power conversion unit 220 by referring to the deration target current value or the deration target output value included in the transmitted output parameter, thereby controlling the discharging of the secondary battery B within the deration target current value or the deration target output value. That is, the discharging output of the secondary battery B is regulated to be less than or equal to the deration target output value, or the discharging current of the secondary battery B is regulated to be less than or equal to the deration target current value. Preferably, the control system 210 controls the power conversion unit 220 to lower the discharging current of the secondary battery B in a stepwise manner toward the deration target current value or to reduce the output of the secondary battery B in a stepwise manner toward the deration target output value.

Next, in operation S80, the control unit 140 determines whether a preset time has elapsed.

If the determination result is YES in operation S80, the control unit 140 goes to operation S90; on the other hand, if the determination result is No in operation S80, then the control unit 140 holds the progress of the process.

In operation S90, the control unit 140 determines whether the operation state of the secondary battery B is in a key-off state.

If the determination result is YES in operation S90, then the control unit 140 terminates the process because the control unit 140 does not need to adjust the output parameter of the secondary battery B. On the other hand, if the determination result is NO in operation S90, the control unit 140 goes to operation S100 to update a time index k and then goes to operation S20 to repeat execution of the above-described operations.

A series of operations shown in FIG. 6 are periodically executed. Thus, if the voltage of the secondary battery B decreases to the threshold voltage or lower, then the output parameter including at least one of the deration target current value and the deration target output value is provided to the control system of the load device 200, such that the discharging current or the discharging output of the secondary battery B is derated until the voltage of the secondary battery B exceeds the threshold voltage. Needless to say, if the voltage of the secondary battery B does not exceed the threshold voltage, the deration target current value and the deration target output value gradually decrease.

In the present disclosure, a threshold voltage that is a criterion for starting the deration mode has been determined considering time factors, i.e., the delay time and the output maintaining time, together. Thus, even if the output parameter is applied after the delay time is passed, it is possible to prevent the voltage of the secondary battery B from decreasing to below the discharging lower limit voltage. Moreover, the output parameter determined in the deration mode includes the current value or the output value sufficiently derated considering $(dR/dt)_{max}$ and thus the voltage of the secondary battery B is prevented from being reduced to below the discharging lower limit voltage during application of the output parameter.

In particular, when the control system 210 of the load device 200 controls discharging of the secondary battery B, a value included in the output parameter may be set as a reference target value for use in lowering the discharging current or output in a stepwise manner, thereby stably and reliably derating the output of the secondary battery B in the latter stage of discharging.

The above-described embodiment may be applied to a situation where the secondary battery is discharged. However, the present disclosure may be similarly applied to a situation where the secondary battery is charged.

When the secondary battery is charged, the threshold voltage is set to approach the charging upper limit voltage and, at this time, both the delay time factor and the output maintaining time factor are also considered at the same time.

Moreover, if the voltage of the secondary battery B increases to the threshold voltage or higher, then the output parameter may be determined in the deration mode to derate the charging current or the charging output.

In Equation 2 used in determination of the deration target current value, $V_{min}$ may be replaced with $V_{max}$.

Furthermore, discharging profiles used in determination of the level of the threshold voltage are substituted by charging profiles.

The charging profiles may be obtained by conducting a constant current charging test for each state of charge and each temperature of the secondary battery B.

The magnitude of the charging current used in each constant current charging test is set to be the same as a maximum charging current value determined by the HPPC method. The maximum charging current value differs with a state of charge and a temperature of the secondary battery B.

Meanwhile, if the maximum charging current value determined using the HPPC method is greater than a charging upper limit current value which the secondary battery B may endure, the maximum charging current value is substituted by the charging upper limit current value.

In the deration mode, the output during the charging of the secondary battery B may be determined based on the current value determined as the deration target current value.

An output parameter determined during charging of the secondary battery B is provided to the control system 210 of the load device 200 through the communication interface 160.

If the output parameter is provided to the control system 210, the control system 210 controls the power conversion unit 220 such that the charging current of the secondary battery B is regulated to the current value included in the output parameter or lower, or the charging output of the secondary battery B is regulated to the output value included in the output parameter or lower.

Moreover, preferably, the control system 210 may perform a control operation of derating the charging current or the charging output of the secondary battery B in a stepwise manner, such that the charging current or the charging output of the secondary battery B converges toward the current value or the output value included in the output parameter.

If the voltage of the secondary battery B does not exceed the threshold voltage during charging of the secondary battery B, the maximum charging current value of the secondary battery B may be determined using a power map, and the charging output of the secondary battery B may be determined from the determined maximum charging current value. To this end, the power map may further include reference data regarding the maximum charging current value that is predefined for each state of charge and each temperature of the secondary battery B.

Test Example

Hereinbelow, a test example according to the present disclosure will be described. The test example described herein is provided to describe effects of the present disclosure and the present disclosure is not limited by details described as the test example.

First, a lithium secondary battery having a total capacity of 36 Ah and a state of charge of 20% was prepared. The lithium secondary battery included lithium metal oxide as a cathode material and graphite as an anode material. Next, the lithium secondary battery was connected to a charging/discharging simulator capable of adjusting charging/discharging power. Then, a discharging profile was measured during discharging of the lithium secondary battery in a discharging current of 360 A under a condition of 25 degrees Celsius.

A threshold voltage which is a criterion for derating an output of the secondary battery B was set to 2.87V. When the threshold voltage was determined, the delay time factor was set to 2 seconds and the output maintaining time factor was set to 6 seconds.

During constant-current discharging of the secondary battery B in 360 A, the discharging output of the secondary battery B was derated according to an embodiment of the present disclosure when the voltage of the secondary battery B decreased to 2.87V. That is, a deration target current value was determined using Equation 2, and a charging/discharging simulator was controlled such that the discharging current magnitude of the secondary battery approached the deration target current value by lowering the discharging current magnitude of the secondary battery B by 30 A in a stepwise manner. In this process, a change in the voltage of the secondary battery B was measured.

As parameter values of Equation 2, $V_{min}$ was set to 2.5V, $V_{threshold}$ was set to 2.87V, $(dR/dt)_{max}$ was set to 0.4305759 m$\Omega$, $R_0$ was set to 0.0010618 m$\Omega$, $(t_1-t_0)$ was set to 6 seconds, and $I_0$ was set to 360 A.

Figure 7:
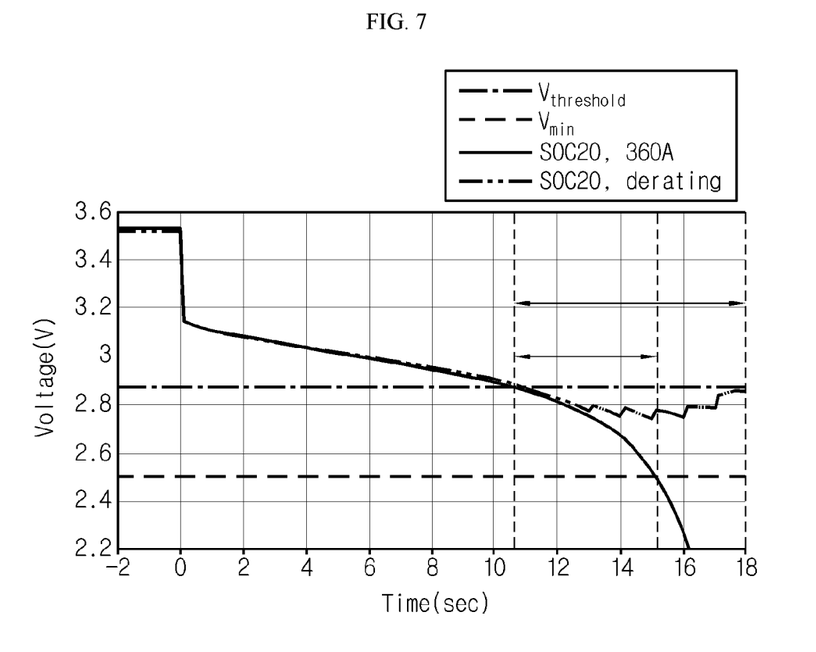
FIG. 7 shows graphs for comparing patterns of voltage changes when a lithium secondary battery having a capacity of 36 Ah and a state of charge of 20% is discharged in 360 A under two conditions that in one condition a power is derated according to an embodiment of the present disclosure and in the other condition the power is not derated.

FIG. 7 shows a voltage measurement result obtained in the current test example. In FIG. 7, a solid line graph shows a change in the voltage when the output of the lithium secondary battery was not derated. On the other hand, a dotted line shows a pattern of the voltage change when the output of the lithium secondary battery was derated from 2.87V.

Comparing the two patterns of the voltage changes, when the output of the lithium secondary battery was derated according to an embodiment of the present disclosure, the voltage of the lithium secondary battery was not abruptly lowered after reaching the threshold voltage and the degree of voltage reduction was derated.

Further, if the output of the lithium secondary battery was not derated, the voltage of the lithium secondary battery reached the discharging lower limit voltage within only 4.5 seconds. However, it was verified that if output deration was applied as soon as the voltage of the lithium secondary battery reached the threshold voltage, the voltage level of the lithium secondary battery was maintained higher than the discharging lower limit voltage during a sufficient time of 6 seconds or longer. Such a test result supports that the present disclosure provides a stable and reliable output adjustment technique.

When various embodiments of the present disclosure are described, elements referred to as '~ unit' should be understood as elements that are functionally divided rather than elements that are physically divided. Therefore, each element may be selectively integrated with another element or each element may be divided into sub elements for efficient execution of control logic(s). However, it would be obvious to those of ordinary skill in the art that even if elements are integrated or divided, the integrated or divided elements also fall within the scope of the present disclosure as long as the sameness of functions may be recognized.

Although the present disclosure has been described with reference to limited embodiments and drawings, the present disclosure is not limited thereto, and it would be obvious that various modifications and changes may be made by those of ordinary skill in the art without departing from the scope of the present disclosure and a scope equivalent to the appended claims.

INDUSTRIAL APPLICABILITY

According to the present disclosure, the magnitude of a current flowing through the secondary battery or an output is derated at a proper timing, such that even if an output parameter is applied after the delay time, the voltage of the secondary battery does not deviate from an operating voltage range.

Furthermore, from a timing at which a time required until the voltage of the secondary battery changes from the threshold voltage to the operating limit voltage becomes shorter than the preset output maintaining time, the output of the secondary battery is actively derated, thereby maintaining the output of the secondary battery for the output maintaining time or longer.

The present disclosure prevents the voltage of the secondary battery from deviating from the operation voltage range when the voltage of the secondary battery approaches the operation limit voltage.

What is claimed is:
1. A system for adjusting an output parameter of a secondary battery, the system comprising:

a voltage measurement unit, a current measurement unit, and a temperature measurement unit configured to measure a voltage, a current, and a temperature of the secondary battery, respectively; and a control unit configured to be electrically connected with the voltage measurement unit, the current measurement unit, and the temperature measurement unit, wherein the control unit is configured to receive a measurement result from the voltage measurement unit, the current measurement unit, and the temperature measurement unit and determine a voltage, a current, and a temperature of the secondary battery during discharging of the secondary battery, to determine a state of charge of the secondary battery using the current, to determine a deration target current value calculated from a maximum value of a predefined resistance change rate, which corresponds to the state of charge and the temperature, and an output maintaining time, when the voltage of the secondary battery decreases to a preset threshold voltage or lower, and to provide an output parameter comprising at least one of the deration target current value and a deration target output value determined from the deration target current value to a control system of a load device supplied with power from the secondary battery, wherein the output maintaining time is a time at least during which a discharging output of the secondary battery has to be maintained, and wherein the maximum value of the predefined resistance change rate is a value obtained by dividing, by a magnitude of a maximum discharging current, a maximum of absolute values of a primary differential value calculated with respect to a discharging profile corresponding to the state of charge and the temperature of the secondary battery.

2. The system of claim 1, wherein when a time taken until the output parameter is applied is defined as a delay time, a level of the threshold voltage is set such that when the secondary battery is discharged in a maximum discharging current value corresponding to the state of charge and the temperature, a time taken until the voltage of the secondary battery decreases to a discharging lower limit voltage from the threshold voltage is greater than the delay time and less than the output maintaining time.

3. The system of claim 1, wherein the control unit is configured to determine a deration target current value of the secondary battery using the following equation:

$$I_{derate} = \frac{V_{min} - V_{threshold} + I_0 \times R_0}{R_0 + \left[\frac{dR}{dt}\right]_{max}(t_1 - t_0)}$$

wherein $I_{derate}$ indicates a deration target current value, $V_{min}$ indicates a discharging lower limit voltage, $V_{threshold}$ indicates a threshold voltage, $I_0$ indicates a discharging current value when the voltage of the secondary battery reaches the threshold voltage or a maximum discharging current value corresponding to the state of charge and the temperature of the secondary battery, $R_0$ indicates an internal resistance of the secondary battery, $t_1-t_0$ indicates the output maintaining time, $(dR/dt)_{max}$ indicates the maximum value of the predefined resistance charge rate which is obtained by dividing, by the magnitude of the maximum discharging current, $I_{max}$, the maximum of absolute values of a primary differential value dV/dt calculated with respect to the discharging profile corresponding to the state of charge and the temperature of the secondary battery between two intersections at which the discharging profile meets a straight line $V=V_{threshold}$ and a straight line $V=V_{min}$, and $I_{max}$ indicates the maximum discharging current value corresponding to the state of charge and the temperature of the secondary battery.

4. The system of claim 1, wherein the control unit is configured to determine a deration target output value based on multiplication of the deration target current value and a discharging lower limit voltage.

5. The system of claim 1, further comprising a memory unit configured to store a maximum value of a predefined resistance change rate corresponding to the state of charge and the temperature.

6. The system of claim 1, further comprising a communication interface electrically coupled with the control unit,
wherein the control unit is configured to periodically transmit the output parameter to the control system through the communication interface.

7. The system of claim 1, wherein the control unit is configured to determine a maximum discharging current value corresponding to a state of charge and a temperature of the secondary battery by referring to data of a maximum discharging current value that is predefined for each state of charge and each temperature of the secondary battery when a voltage of the secondary battery is higher than the threshold voltage, and
to provide an output parameter comprising at least one of the maximum discharging current value and an available output value calculated from the maximum discharging current value to a control system of the load device.

8. A method of adjusting an output parameter of a secondary battery, the method comprising:
(a) measuring a voltage, a current, and a temperature of the secondary battery during discharging of the secondary battery;
(b) determining a state of charge of the secondary battery by using the current;
(c) determining a deration target current value from a maximum value of a predefined resistance change rate, which corresponds to the state of charge and the temperature, and an output maintaining time, when the voltage of the secondary battery decreases to a preset threshold voltage or lower;
(d) determining an output parameter comprising at least one of the deration target current value and the deration target output value determined from the deration target current value; and
(e) providing the output parameter to a control system of a load device supplied with power from the secondary battery,
wherein the output maintaining time is a time at least during which a discharging output of the secondary battery has to be maintained, and
wherein the maximum value of the predefined resistance change rate is a value obtained by dividing, by a magnitude of a maximum discharging current, a maximum of absolute values of a primary differential value calculated with respect to a discharging profile corresponding to the state of charge and the temperature of the secondary battery.

9. The method of claim 8, wherein when a time taken until the output parameter is applied is defined as a delay time, a level of the threshold voltage is set such that when the secondary battery is discharged by a maximum discharging current value corresponding to the state of charge and the temperature, a time taken until a voltage of the secondary battery decreases to a discharging lower limit voltage from the threshold voltage is greater than the delay time and less than the output maintaining time.

10. The method of claim 8, wherein the operation (c) comprises determining a deration target current value of the secondary battery using the following equation:

$$I_{derate} = \frac{V_{min} - V_{threshold} + I_0 \times R_0}{R_0 + \left[\frac{dR}{dt}\right]_{max}(t_1 - t_0)}$$

wherein $I_{derate}$ indicates a deration target current value, $V_{min}$ indicates a discharging lower limit voltage, $V_{threshold}$ indicates a threshold voltage, $I_0$ indicates a discharging current value when the voltage of the secondary battery reaches the threshold voltage or a maximum discharging current value corresponding to the state of charge and the temperature of the secondary battery, $R_0$ indicates an internal resistance of the secondary battery, $t_1-t_0$ indicates the output maintaining time, $(dR/dt)_{max}$ indicates the maximum value of the predefined resistance charge rate which is obtained by dividing, by the magnitude of a maximum discharging current, $I_{max}$, the maximum of absolute values of a primary differential value dV/dt calculated with respect to the discharging profile corresponding to the state of charge and the temperature of the secondary battery between two intersections at which the discharging profile meets a straight line $V=V_{threshold}$ and a straight line $V=V_{min}$, and $I_{max}$ indicates the maximum discharging current value corresponding to the state of charge and the temperature of the secondary battery.

11. The method of claim 8, wherein the operation (d) comprises determining a deration target output value based on multiplication of the deration target current value and a discharging lower limit voltage.

12. The method of claim 8, wherein the operation (e) comprises periodically transmitting the output parameter to the control system through a communication interface.

13. The method of claim 8, further comprising:
determining the maximum discharging current value corresponding to the state of charge and the temperature of the secondary battery by referring to data of the maximum discharging current value that is predefined for each state of charge and each temperature of the secondary battery when a voltage of the secondary battery is higher than the threshold voltage;
determining an output parameter comprising at least one of the maximum discharging target current value and an available output value calculated from the maximum discharging target current value; and
providing the output parameter to the control system of the load device.

14. A system for adjusting an output parameter of a secondary battery, the system comprising:
a voltage measurement unit, a current measurement unit, and a temperature measurement unit configured to measure a voltage, a current, and a temperature of the secondary battery, respectively; and a control unit configured to be electrically connected with the voltage measurement unit, the current measurement unit, and the temperature measurement unit,
wherein the control unit is configured to receive a measurement result from the voltage measurement unit, the current measurement unit, and the temperature measurement unit and determine a voltage, a current, and a temperature of the secondary battery during charging of the secondary battery, to determine a state of charge of the secondary battery using the current, to determine a deration target current value calculated from a maximum value of a predefined resistance change rate, which corresponds to the state of charge and the temperature, and an output maintaining time, when the voltage of the secondary battery increases to a preset threshold voltage or higher, and to provide an output parameter comprising at least one of the deration target current value and a deration target output value determined from the deration target current value to a control system of a load device supplied with power from the secondary battery,
wherein the output maintaining time is a time at least during which a discharging output of the secondary battery has to be maintained, and
wherein the maximum value of the predefined resistance change rate is a value obtained by dividing, by the magnitude of a maximum discharging current, a maximum of absolute values of a primary differential value calculated with respect to a discharging profile corresponding to the state of charge and the temperature of the secondary battery.

15. A method of adjusting an output parameter of a secondary battery, the method comprising:
(a) measuring a voltage, a current, and a temperature of the secondary battery during charging of the secondary battery;
(b) determining the state of charge of the secondary battery by using the current;
(c) determining a deration target current value from a maximum value of a predefined resistance change rate, which corresponds to the state of charge and the temperature, and an output maintaining time, when the voltage of the secondary battery increases to a preset threshold voltage or higher;
(d) determining an output parameter comprising at least one of the deration target current value and the deration target output value determined from the deration target current value; and
(e) providing the output parameter to a control system of a load device supplying charging power to the secondary battery,
wherein the output maintaining time is a time at least during which a discharging output of the secondary battery has to be maintained, and
wherein the maximum value of a predefined resistance change rate is a value obtained by dividing, by a magnitude of a maximum discharging current, a maximum of absolute values of a primary differential value calculated with respect to a discharging profile corresponding to the state of charge and the temperature of the secondary battery.

* * * * *